(12) United States Patent
Thallner (10) Patent No.: US 8,905,111 B2
(45) Date of Patent: Dec. 9, 2014

(54) DEVICE FOR RELEASING AN INTERCONNECT LAYER THAT PROVIDES CONNECTION BETWEEN A CARRIER AND A WAFER

(71) Applicant: EV Group GmbH, St. Florian (AT)

(72) Inventor: Erich Thallner, St. Florian (AT)

(73) Assignee: EV Group GmbH, St. Florian (AT)

( * ) Notice: Subject to any disclaimer, the term of this patent is extended or adjusted under 35 U.S.C. 154(b) by 0 days.

(21) Appl. No.: 13/961,940

(22) Filed: Aug. 8, 2013

(65) Prior Publication Data

US 2013/0327485 A1    Dec. 12, 2013

Related U.S. Application Data

(60) Continuation of application No. 13/760,696, filed on Feb. 6, 2013, now Pat. No. 8,603,294, which is a division of application No. 13/254,940, filed as application No. PCT/EP2010/001630 on Mar. 16, 2010, now Pat. No. 8,443,864.

(30) Foreign Application Priority Data

Mar. 18, 2009    (EP) .................................... 09003874

(51) Int. Cl.
    *B32B 38/10*    (2006.01)
    *B32B 43/00*    (2006.01)
    *H01L 21/67*    (2006.01)

(52) U.S. Cl.
    CPC ........ *B32B 43/006* (2013.01); *H01L 21/67092* (2013.01); *Y10S 156/93* (2013.01); *Y10S 156/931* (2013.01); *Y10S 156/932* (2013.01); *Y10S 156/941* (2013.01); *Y10S 156/943* (2013.01)

USPC ........... 156/750; 156/703; 156/930; 156/931; 156/932; 156/941; 156/943

(58) Field of Classification Search
None
See application file for complete search history.

(56) References Cited

U.S. PATENT DOCUMENTS

| 3,988,196 A | 10/1976 | Wanesky ....................... 156/541 |
| 5,273,615 A | 12/1993 | Asetta et al. ................... 156/584 |

(Continued)

FOREIGN PATENT DOCUMENTS

| AT | 502 233 | 4/2007 | ............. H01L 21/68 |
| DE | 197 34 635 | 2/1999 | ............. H01L 21/68 |

(Continued)

OTHER PUBLICATIONS

Howell W C: "The Direct Demount of Thinned GaAs Wafers to Sawing Tape", 1990, Digest of Papers(1990 U.S. Conference on GaAs Manufacturing Technology: April 1-3, 1990 Bally'S Reno, Reno, Nevada, 5 pages.

(Continued)

*Primary Examiner* — Mark A Osele
*Assistant Examiner* — Nickolas Harm
(74) *Attorney, Agent, or Firm* — Kusner & Jaffe (57) ABSTRACT

A device for releasing an interconnect layer that provides a connection between a carrier and a wafer which forms a carrier-wafer combination. The device includes rotation means for rotation of the carrier-wafer combination in a release position, and a connection release means for providing an immersion bath that receives the carrier-wafer combination.

18 Claims, 6 Drawing Sheets

(56) References Cited

U.S. PATENT DOCUMENTS

| | | | |
|---|---|---|---|
| 5,688,411 A | 11/1997 | Kutsuzawa et al. | 216/92 |
| 5,800,665 A | 9/1998 | Okaniwa et al. | 156/344 |
| 6,062,288 A | 5/2000 | Tateyama | 156/756 |
| 6,066,229 A * | 5/2000 | Komine et al. | 156/718 |
| 6,090,687 A | 7/2000 | Merchant et al. | 438/455 |
| 6,238,511 B1 | 5/2001 | Sada et al. | 156/704 |
| 6,342,434 B1 | 1/2002 | Miyamoto et al. | 438/464 |
| 6,462,415 B1 | 10/2002 | Ishiguri et al. | 257/738 |
| 6,713,880 B2 | 3/2004 | Sahara et al. | 257/783 |
| 6,792,991 B2 | 9/2004 | Thallner | 156/539 |
| 7,211,168 B2 | 5/2007 | Miyanari | 156/344 |
| 7,438,631 B2 | 10/2008 | Nagamoto et al. | 451/59 |
| 7,497,916 B2 | 3/2009 | Hayashi et al. | 156/64 |
| 7,829,152 B2 | 11/2010 | Thie et al. | 427/443.1 |
| 2002/0106869 A1 | 8/2002 | Otsu et al. | 438/459 |
| 2003/0113984 A1 | 6/2003 | Okada et al. | 438/459 |
| 2004/0089397 A1 | 5/2004 | Cheng et al. | 156/67 |
| 2005/0101103 A1 | 5/2005 | Yamamoto | 438/455 |
| 2005/0236693 A1 | 10/2005 | Kroninger et al. | 257/619 |
| 2006/0032587 A1 | 2/2006 | Hecht et al. | 156/382 |
| 2007/0125751 A1 | 6/2007 | Nakamura et al. | 216/83 |
| 2007/0155129 A1 | 7/2007 | Thallner | 438/455 |
| 2007/0295458 A1 | 12/2007 | Akechi | 156/510 |
| 2008/0014715 A1 | 1/2008 | Leitner et al. | 438/458 |
| 2009/0305617 A1 | 12/2009 | Nakamura et al. | 451/365 |
| 2012/0000613 A1 | 1/2012 | Thallner | 156/703 |

FOREIGN PATENT DOCUMENTS

| | | | | |
|---|---|---|---|---|
| DE | 100 48 881 | | 3/2002 | H01L 21/58 |
| DE | 101 08 369 | | 8/2002 | H01L 21/58 |
| DE | 103 40 409 | | 4/2005 | H01L 21/00 |
| DE | 10 2004 018 250 | | 11/2005 | H01L 21/68 |
| DE | 10 2006 000 687 | | 7/2007 | H01L 21/673 |
| DE | 10 2006 032 488 | | 1/2008 | H01L 21/58 |
| EP | 1 298 713 | A1 | 4/2003 | H01L 21/304 |
| EP | 2 230 683 | | 9/2010 | H01L 21/00 |
| JP | 06-268051 | | 9/1994 | H01L 21/68 |
| JP | 06275717 | | 9/1994 | H01L 21/78 |
| JP | 6-291184 | | 10/1994 | H01L 21/78 |
| JP | 08-102434 | | 4/1996 | H01L 21/027 |
| JP | 8-250390 | | 9/1996 | H01L 21/027 |
| JP | 2002-237515 | | 8/2002 | H01L 21/68 |
| JP | 2003-338475 | | 11/2003 | H01L 21/304 |
| JP | 2004-193237 | | 7/2004 | H01L 21/68 |
| JP | 2005-123382 | | 5/2005 | H01L 21/304 |
| JP | 2006-032506 | | 2/2006 | H01L 21/68 |
| JP | 2006-156679 | | 6/2006 | H01L 21/02 |
| JP | 2007-048920 | | 2/2007 | H01L 21/301 |
| JP | 2009-182067 | | 8/2009 | H01L 21/683 |
| JP | 2009-182256 | | 8/2009 | H01L 21/683 |
| TW | 200520139 | | 6/2005 | |
| WO | WO 2006/129458 | | 12/2006 | H01L 21/683 |

OTHER PUBLICATIONS

International Search Report for International Application No. PCT/EP2010/001630, Apr. 22, 2010.

Notification of Reasons for Rejection (dated Aug. 20, 2013) issued in connection with corresponding Japanese Patent Application No. 2012-500135, with English translation.

Notifications of Reasons for Rejection (dated Dec. 17, 2013) issued in connection with corresponding Japanese Patent Application No. 2013-009033, with English translation.

Office Action (dated Mar. 19, 2014) issued in connection with corresponding Taiwan Patent Application No. 102106439, with English translation.

* cited by examiner

DEVICE FOR RELEASING AN INTERCONNECT LAYER THAT PROVIDES CONNECTION BETWEEN A CARRIER AND A WAFER

RELATED APPLICATIONS

The present application is a continuation of U.S. application Ser. No. 13/760,696, filed Feb. 6, 2013, which is a divisional of U.S. application Ser. No. 13/254,940, filed Sep. 6, 2011 (now U.S. Pat. No. 8,443,864), which is a U.S. National Stage Application of International Application No. PCT/EP2010/001630, filed Mar. 16, 2010, which claims priority from European Patent Application No. 09003874.6, filed Mar. 18, 2009, said patent applications hereby fully incorporated herein by reference.

FIELD OF THE INVENTION

The invention relates to a device for stripping a wafer from a carrier that is connected to the wafer by an interconnect layer and a method for stripping a wafer from a carrier that is connected to the wafer by an interconnect layer.

BACKGROUND OF THE INVENTION

The back-thinning of wafers is often necessary in the semiconductor industry and can take place mechanically and/or chemically. For purposes of back-thinning, in general the wafers are temporarily fixed on a carrier, there being various methods for the fixing. As carrier material, for example, films, glass substrates or silicon wafers can be used.

Depending on the carrier materials used and the interconnect layer used between the carrier and the wafer, different methods for dissolving or destroying the interconnect layer are known, such as, for example, the use of UV-light, laser beams, temperature action or solvents.

Stripping increasingly constitutes one of the most critical process steps since thin substrates with substrate thicknesses of a few µm easily break during stripping/peeling or are damaged by the forces that are necessary for the stripping process.

Moreover, thin substrates have hardly any stability of shape or none at all and typically curl without support material. During handling of the back-thinned wafer, therefore, fixing and support of the wafer are essentially indispensable.

DE 10 2006 032 488 B4 describes a method for heating the bonding substance by means of laser light, the connecting action of the bonding substance being neutralized by the associated considerable temperature increase to 400 to 500° C. Thus, the problem of heating the entire wafer stack (see there: [0021]) is solved. At least the edge region and—due to good thermal conductivity of the wafer material—also the region adjacent to the edge region are, however, subjected to a considerable temperature increase. The problem here is also the resulting temperature gradient.

SUMMARY OF THE INVENTION

Therefore, the object of this invention is to devise a device and a method to detach a wafer from a carrier as nondestructively as possible.

This object is achieved with the features of the independent claims. Advantageous further developments of the invention are given in the dependent claims. The framework of the invention also encompasses all combinations of at least two of the features given in the specification, the claims, and/or the figures. In the specified value ranges, values that lie within the indicated limits will also be disclosed as boundary values and they are to be claimed in any combination.

The invention is based on the idea of devising a device with which stripping is enabled at a temperature of less than 350° C. It has been found that the temperature ranges above 350° C. can be harmful to the wafer. For higher temperatures, moreover, more energy is required so that the device according to the invention requires less energy to detach the wafer from the carrier.

Accordingly, the device according to the invention for stripping a wafer from a carrier that is connected to the wafer by an interconnect layer can be characterized by the following features:
- a receiving means for accommodating a carrier-wafer combination consisting of the carrier and the wafer,
- a connection release means for unfixing, in particular breaking the connection provided by the interconnect layer between the carrier and the wafer, and
- stripping means for stripping the wafer from the carrier, or for stripping the carrier from the wafer, the connection release means being made to work in a temperature range from 0 to 350° C., especially from 10 to 200° C., preferably from 20 to 80° C., and more preferably at ambient temperature.

Furthermore, according to the invention, a method for stripping a wafer from a carrier that is connected to the wafer by an interconnect layer can have the following steps:
- accommodating a carrier-wafer combination consisting of the carrier and the wafer on a receiving means,
- unfixing, in particular breaking the connection provided by the interconnect layer between the carrier and the wafer by a connection release means, and
- stripping the wafer from the carrier, or for stripping the carrier from the wafer by stripping means.

the connection release means working in a temperature range of up to 350° C., especially from 10 to 200° C., preferably from 20 to 80° C., and more preferably at ambient temperature.

A wafer is defined as a product substrate, for example a semiconductor wafer, which conventionally is thinned to a thickness of between 0.5 µm and 250 µm, the trend being toward thinner and thinner product substrates.

The carrier is, for example, a carrier substrate with a thickness of between 50 µm and 5,000 µm.

The interconnect layer can be an adhesive, for example a soluble adhesive, especially a thermoplastic, which is applied, for example, selectively in an edge region of the carrier-wafer combination, especially in an edge zone from 0.1 to 20 mm. Alternatively, the adhesive can be applied over the entire surface, and the adhesive force can be reduced in the center by an adhesion-reducing layer, for example a fluoropolymer, preferably Teflon.

The receiving means is especially suitably a chuck, especially a spinner chuck for accommodating the carrier-wafer combination, especially by means of negative pressure, for example suction paths, holes or suction cups. Alternatively, a mechanical accommodation, for example by lateral clamps, is conceivable.

The stripping means can be an upper substrate receiver, for example a release chuck, preferably by application of negative pressure, for example suction paths, holes or suction cups.

In one advantageous embodiment of the invention, it is provided that the connection release means is made to work essentially without heating. In this way, it is possible to omit any heating means.

In another advantageous embodiment of the invention, it is provided that the connection release means comprises fluid means, especially a solvent that selectively dissolves the interconnect layer, for detaching the interconnect layer. Chemical dissolution of the interconnect layer is especially protective of the wafer, and, with the corresponding material choice, dissolution can also take place very quickly, especially when only edge regions of the wafer are provided with an interconnect layer, so that the solvent can act very quickly from the side. In this way, perforations in the carrier substrate and/or product substrate can be omitted.

In one alternative embodiment of the invention, it is provided that the connection release means comprises mechanical separating means, especially a blade for cutting through the interconnect layer, for detaching the interconnect layer. In this way, especially fast separation of the wafer from the carrier is possible. A combination of mechanical separation means and fluid means is also conceivable.

In another alternative embodiment of the invention, it is provided that the connection release means comprises a UV light source for detaching the interconnect layer. This embodiment can also be combined with the embodiment of the mechanical separating means and/or the embodiment with fluid means.

To the extent the connection release means is made to act especially exclusively from one side edge of the carrier-wafer combination, action on the wafer and/or the carrier from the top and/or bottom, especially the inside region of the wafer that lies within the side edge, can be omitted.

There being a rotation means for rotation of the carrier-wafer combination makes it possible to omit an arrangement of the connection release means over the entire periphery of the carrier-wafer combination, and partial action on the periphery of the carrier-wafer combination is sufficient.

Advantageously, the connection release means has at least one release device that encompasses the side edge, struck especially on the receiving means and/or the stripping means, preferably forming a seal. By the release device encompassing the side edge of the carrier-wafer combination, especially effective action on the interconnect layer is possible. Moreover, the release device is used to protect the wafer, especially to protect the side edge. Furthermore, the measure of encompassing can prevent the fluid means from emerging from the release device or the UV light intensity from being lost. When using mechanical separating means, possible impurities are prevented from escaping from the release device and from contaminating the wafer. The release device can be made U-shaped in cross-section in one advantageous configuration.

To the extent the connection release means, especially the release device, has a working chamber that is preferably sealed to the vicinity, the aforementioned advantages can be still better implemented, especially when using fluid means.

In another advantageous configuration of the invention, it is provided that the working chamber is made to accommodate a peripheral sector of the side edge of the carrier-wafer combination.

Advantageously, the working chamber extends only slightly over the side edge of the carrier-wafer combination in the direction of the center of the wafer, especially up to the receiving direction on the carrier side and up to the stripping means on the wafer side.

Advantageously, the stripping means are made able to rotate, especially are driven by means of the rotary receiving means.

To the extent the connection release means has detergents for cleaning the wafer, at the same time with stripping of the wafer, the latter can be cleaned at least in the region exposed to the interconnect layer.

The method according to the invention is improved in that the interconnect layer in the region of one side edge of the carrier-wafer combination is made adhesive and in one inner region, formed especially from a fluoropolymer, preferably making contact solely with the wafer, is made less adhesive to nonadhesive at least in the direction of the wafer.

Other advantages, features and details of the invention will become apparent from the following description of preferred embodiments and using the drawings.

BRIEF DESCRIPTION OF THE DRAWINGS

In the figures, the same components and components with the same function are identified with the same reference number.

DETAILED DESCRIPTION OF THE INVENTION

Figure 1:
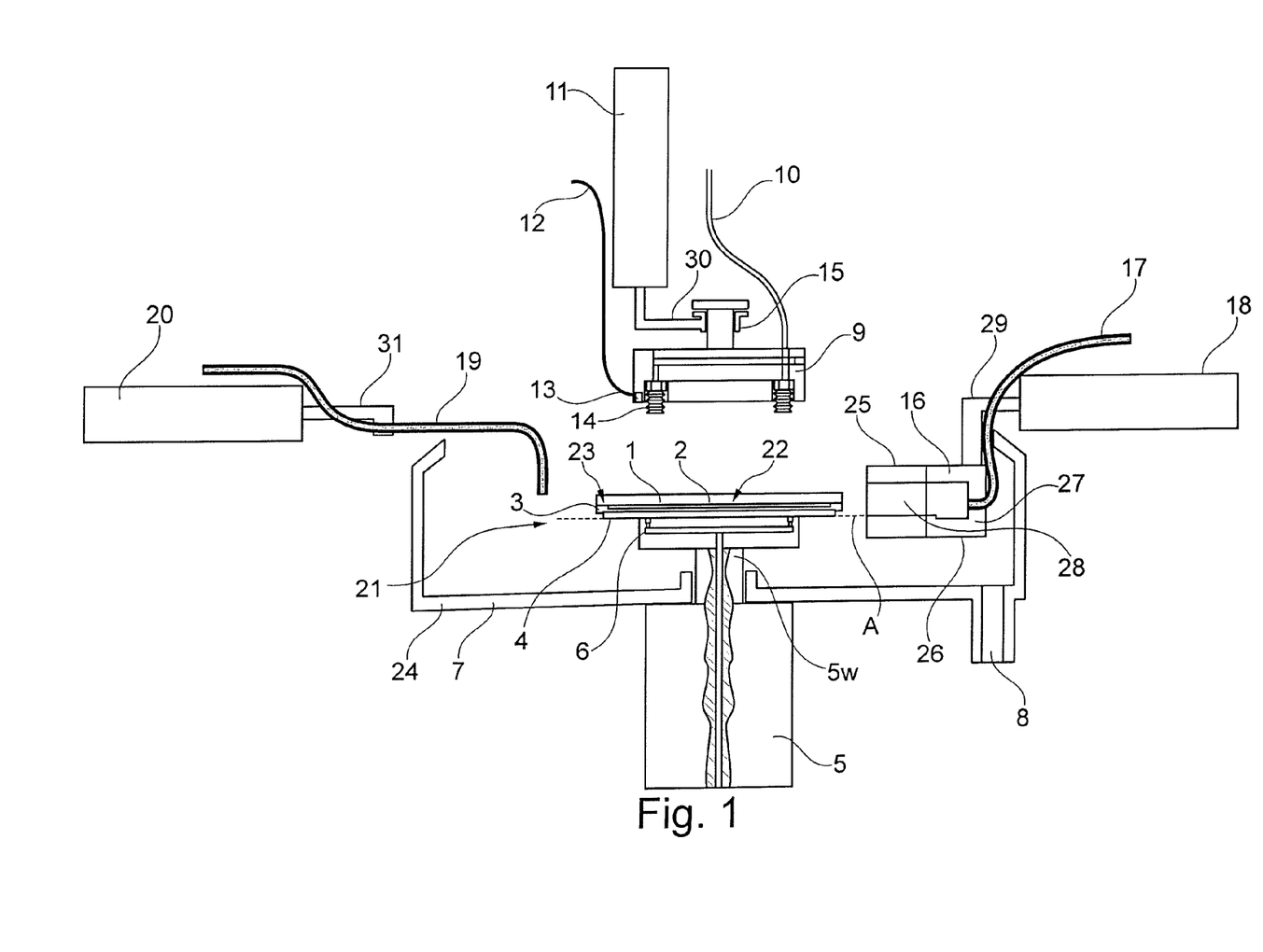
FIG. 1 shows a schematic of the device according to the invention in a first process step according to the invention.

FIG. 1 shows—roughly in the middle—a carrier-wafer combination 21 that consists of at least one wafer 4 and a carrier 1, and that is held on a receiving means 6, especially a chuck, in a horizontal receiving plane A that is formed by the receiving means. The carrier-wafer combination 21 can also be placed, turned by 180°, on the receiving means 6, i.e., with the carrier 1 down and the wafer 4 up. The carrier-wafer combination 21 is supplied by way of a robot arm that is not shown.

According to one especially advantageous embodiment, the receiving means 6 or the device is shown relative to the horizontal so that the receiving plane A is no longer shown horizontally, but rather has a tilt angle to the horizontal that is between 5° and 90°, especially 25° to 90°, preferably 45° to 90°, and even more preferably exactly 90°.

The carrier-wafer combination 21 here furthermore consists of an interconnect layer 3 and an adhesion-reducing layer 2 that is integrated into the interconnect layer 3, and said layer 2 is arranged in the direction of the carrier 1 in an inner region 22 of the carrier-wafer combination 21. Outside of the inner region 22, the interconnect layer 3 projects above the adhesion-reducing layer 2 on one side edge 23 of the carrier-wafer combination 21. The side edge 23 is thus an annular section, and it extends from the outside contour of the carrier-wafer combination 21 or of the carrier 1 to the center of the carrier-wafer combination 21, in a width from 0.1 mm to 20 mm. The wafer 4 typically has a diameter of 300 mm.

The wafer 4, before supply to the device according to the invention, has usually undergone further treatment steps, for example back-thinning to a thickness of 0.5 µm to 250 µm.

The carrier-wafer combination 21 rises above the receiving means 6 at least around the side edge 23. The receiving means 6 accordingly has a smaller diameter than the carrier-wafer combination 21 or the wafer 4 and/or the carrier 1.

The carrier-wafer combination 21 is fixed on the receiving means 6 by negative pressure in the conventional manner, the receiving means 6 being able to rotate by way of a drive motor 5 and a drive shaft 5w that connects the receiving means 6 to the drive motor 5.

The drive motor 5 and the drive shaft 5w can be made as a hollow shaft with vacuum supply in order to be able to advantageously connect the vacuum supply to the rotating receiving means 6.

The carrier-wafer combination 21 is housed in a process chamber 7, the drive motor 5 being located outside of the process chamber 7 and the drive shaft 5w being made to penetrate an opening located in the bottom 24 of the process chamber.

There is furthermore a drain 8 in the bottom 24.

Figure 2:
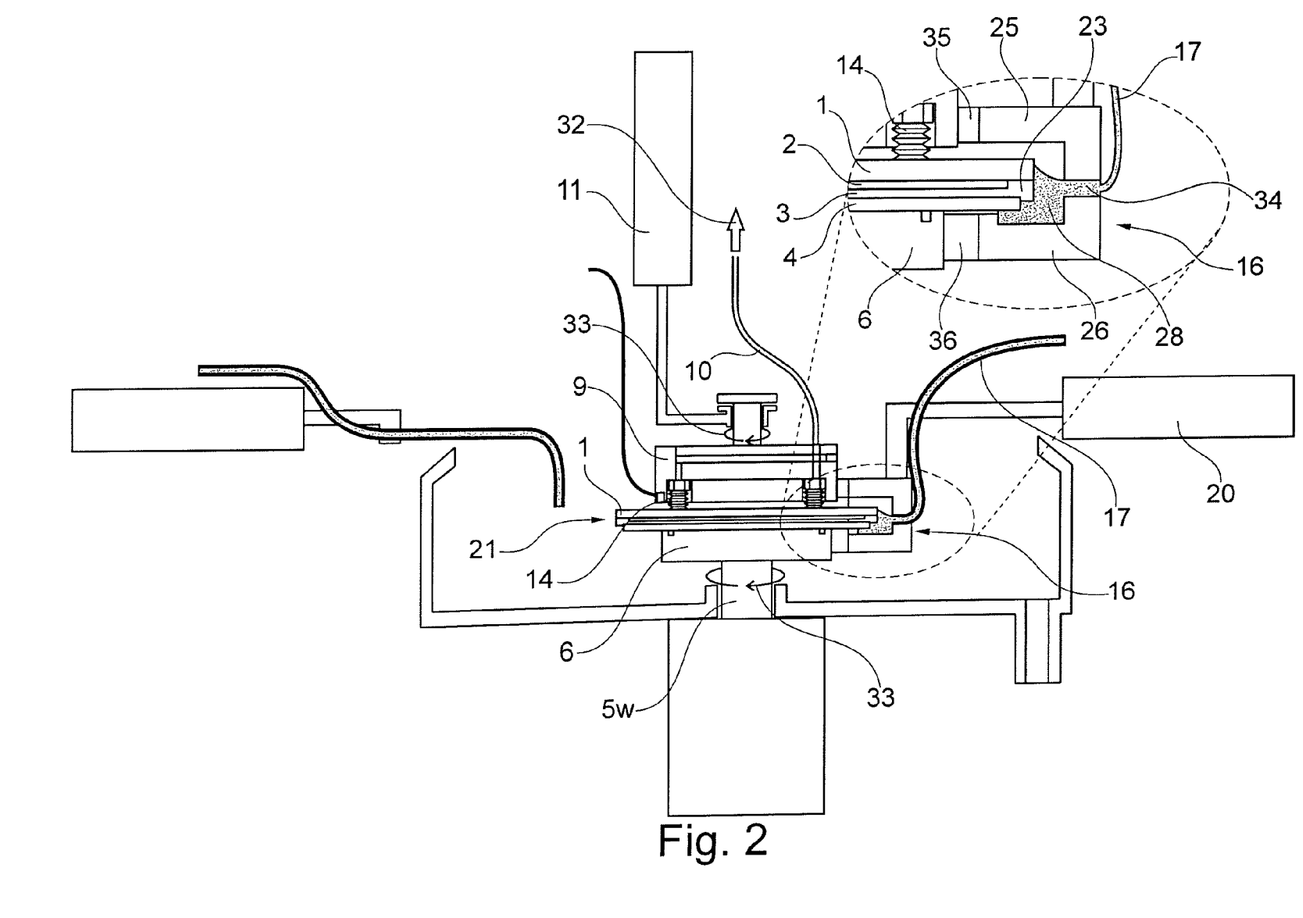
FIG. 2 shows a schematic of the device according to the invention in a second process step according to the invention.

Laterally from the carrier-wafer combination 21, there is a release device 16 that extends over part of the periphery of the carrier-wafer combination 21. The release device 16 is made U-shaped in cross-section and the legs 25, 26 of the release device and one side wall 27 of the release device 16 surround a working chamber 28 that is made open toward the carrier-wafer combination 21. The release device extends over a circular ring segment of the carrier-wafer combination 21 and the legs 25, 26 rise above the side edge 23 in a release position that is shown in FIG. 2 and that corresponds to the second process step of the method according to the invention. To the extent the receiving plane A is tilted, the release device can be made like an immersion bath; this greatly simplifies handling of the device.

The release device 16 can be moved by means of an actuator 18 from the release position into an initial position according to FIG. 1 by way of an L-shaped actuator arm 29 that projects into the process chamber 7.

Above the carrier-wafer combination 21, there are stripping means for stripping the carrier 1 from the wafer 4, the stripping means having a wafer receiver 9, here a chuck.

The wafer receiver 9 is supported on a wafer receiver actuator arm 30 with a capacity to rotate in a wafer receiver support 15 of the wafer receiver actuator arm 30, the wafer receiver support 15 being made as an axial and radial bearing. The wafer receiver support 15 and the wafer receiver 9 are arranged with their axis of rotation flush to the axis of rotation of the drive shaft 5w or the receiving means 6.

The stripping means furthermore have elastic suction cups 14 that are integrated into the wafer receiver 9 and that are made here as bellows. The suction cups 14 are connected to a pressure line 10 that is connected in turn to a vacuum means. Thus, the carrier 1 in the region of the suction cups 14 can be sucked onto the wafer receiver 9.

Furthermore, the device according to the invention as shown in FIG. 1 has a solvent line 19 that is connected via a solvent actuator arm 31 to a solvent actuator 20 for cleaning the wafer 4 after stripping the carrier from the wafer 4.

With a sensor that is intended for distance measurement and that is integrated into the wafer receiver 9, the stripping of the carrier 1 from the wafer 4 can be measured, specifically by way of a sensor line 12.

After receiving the carrier-wafer combination 21 according to FIG. 1, the wafer receiver 9 is lowered by the wafer receiver actuator 11 onto the carrier 1 until the suction cups 14 rest on the carrier 1.

Then, a vacuum is applied to the suction cups 14 via the pressure line 10; this is shown by an arrow 32.

Thus, the wafer receiver 9 is mechanically connected to the carrier-wafer combination 21 and the receiving means 6 so that by the drive motor 5, rotation of the receiving means 6, of the wafer receiver 9 and of the carrier-wafer combination 21 that is located in between can be effected. Rotation is shown by the rotary arrow 33. Alternatively, rotation can take place intermittently, especially by alternate pivoting motion with a limited angle between 90° and 360°, and by the pivoting motion, the periphery of the carrier-wafer combination 21 will be more or less completely detectable by the release device 16.

During continuous rotation, a rotary shaft can be advantageously provided for supply to the wafer receiver 9 for the pressure line 10 and the sensor line 12.

Then, the release device 16 is moved by the release device actuator 20 into the release position that is shown in FIG. 2 and that is also shown in an enlarged extract located at the top right in FIG. 2.

Then, the solvent 34 is delivered via the fluid line 17 into the working chamber 28 of the release device 16, where the solvent 34 comes into contact with the interconnect layer 3 in the region of the side edge 23 and leads to dissolution of the interconnect layer 3 from the side.

The working chamber 28 can be sealed by contact of the release device 16, especially of the legs 25 and 26 with their faces 35 and 36, against the receiving means 6, or the wafer receiver 9 can be sealed to the vicinity.

Sealing is conversely not critically necessary, but leads to cutting down on the solvent 34.

Figure 3A:
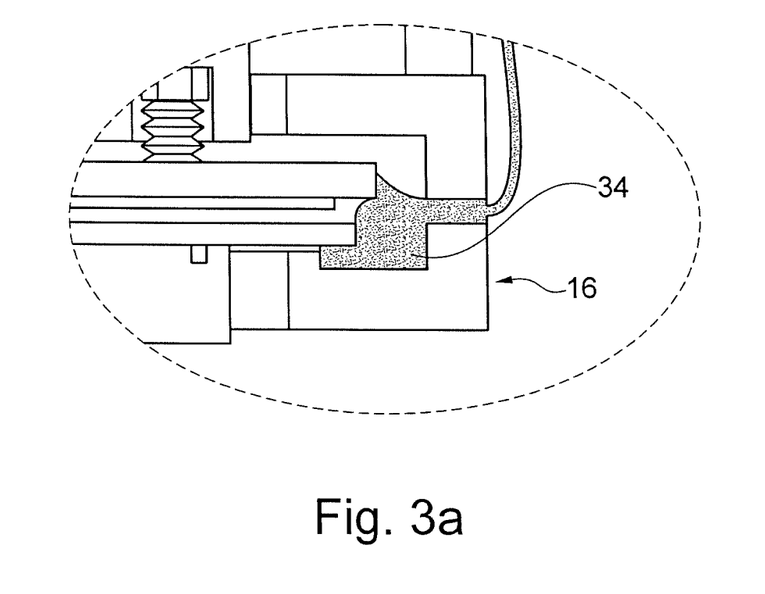
FIGS. 3a, 3b, 3c show a schematic detail view of the release device according to the invention in a second process step according to the invention.
Figure 3B:
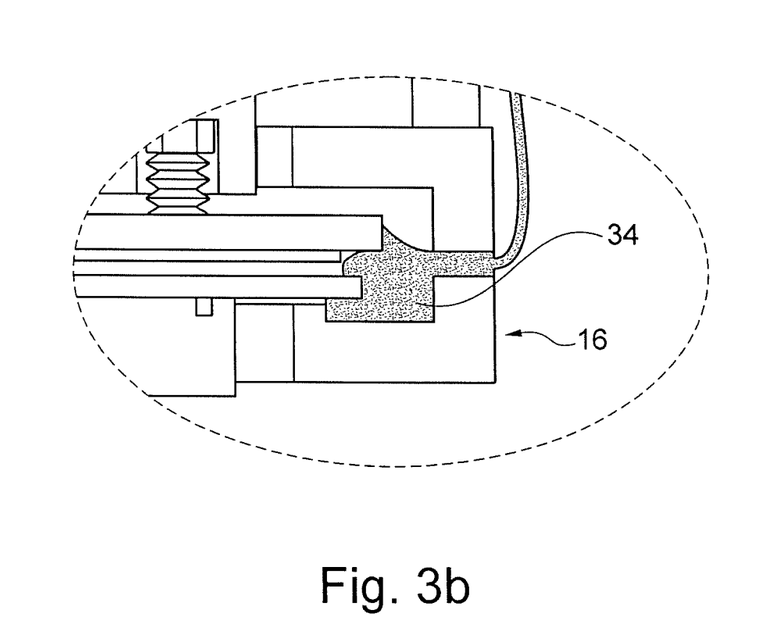
Figure 3C:
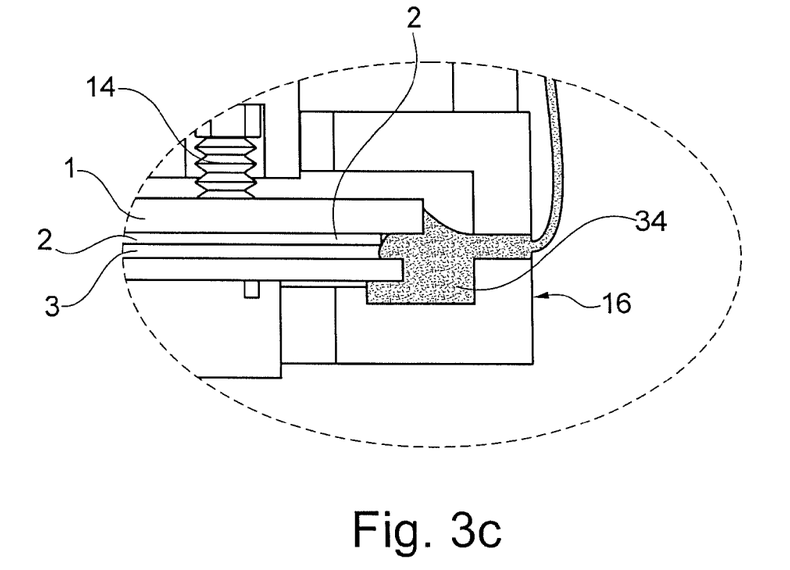

The progress of dissolving of the interconnect layer 3 in the region of the side edge 23 is shown in FIGS. 3a, 3b and finally 3c.

Figure 4:
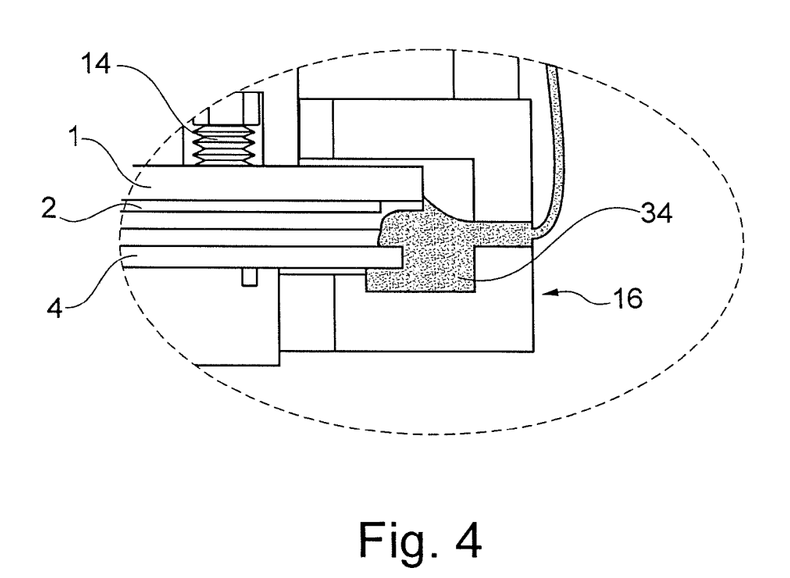
FIG. 4 shows a schematic detail view of the release device according to the invention in a third process step according to the invention.

When almost complete dissolution of the edge region of the interconnect layer 3 that is shown in FIG. 3c as far as the adhesion-reducing layer 2 is achieved, the wafer 4 is raised off the carrier 1 by the suction cups 14 made as bellows, since the adhesion-reducing layer 2 does not apply sufficient adhesive force compared to the drawing force that is acting due to the suction cups 14. The sensor 13 that measures the distance of the carrier 1 to the wafer receiver 9 establishes that the carrier 1 is stripped from the wafer 4 (see FIG. 4), so that the supply of solvent 34 into the working chamber 28 can be stopped and the release device 16 can be moved by the release device actuator 20 into the initial position shown in FIG. 5.

Figure 5:
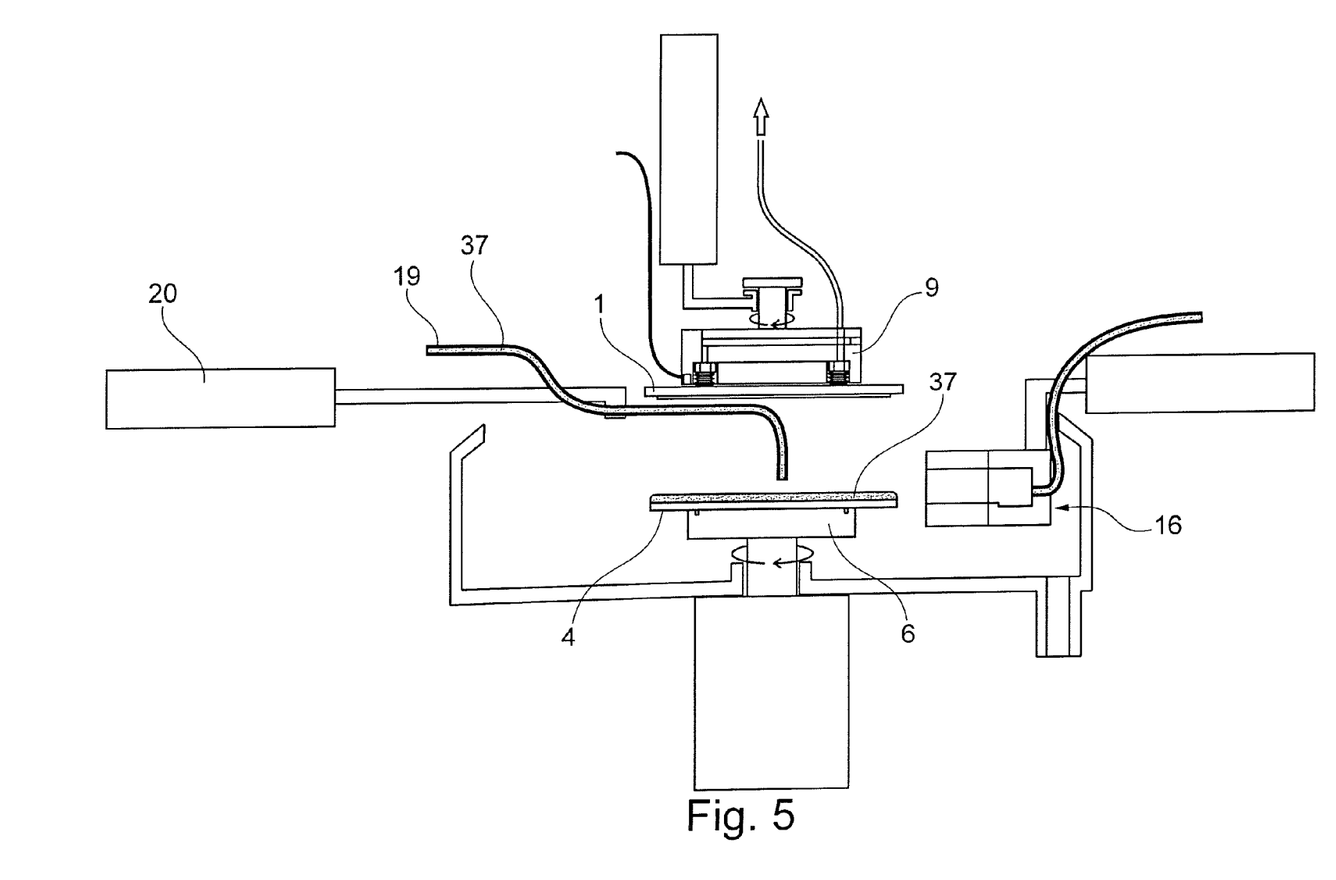
FIG. 5 shows a schematic of the device according to the invention in a cleaning step for cleaning a carrier according to the invention.

Then, the carrier 1 is raised by the wafer receiver actuator 11 in order to enable cleaning of the wafer 4 by means of the solvent line 19. The solvent 37 that has been applied by way of the solvent line 19 is removed after the wafer 4 is cleaned by rotation of the wafer 4.

Then, the wafer 4 can be supplied by a robot arm to additional devices and process steps, and the device according to the invention can be loaded with a new carrier-wafer combination 21.

Figure 6:
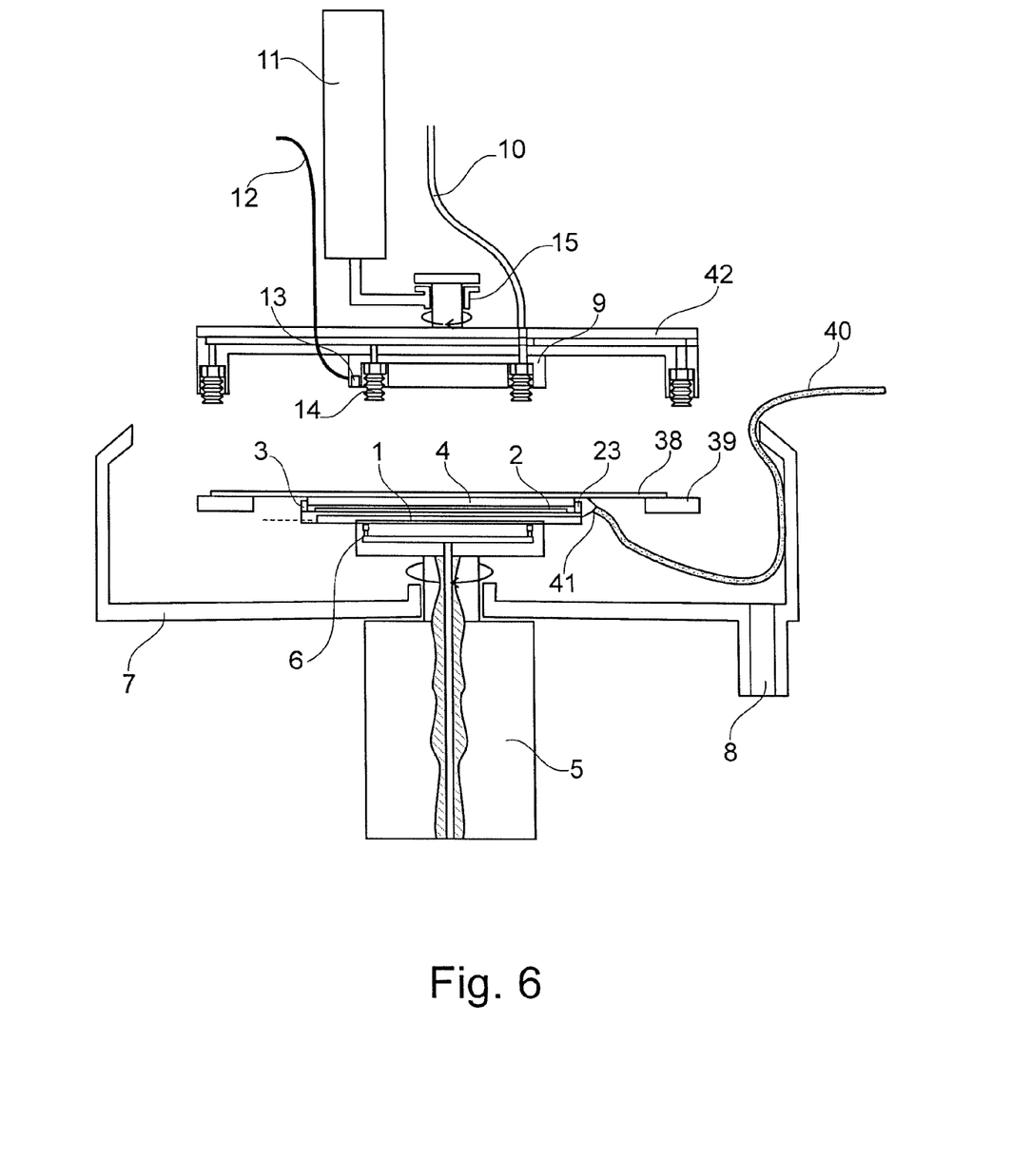
FIG. 6 shows a schematic of the device according to the invention in one alternative embodiment.

FIG. 6 shows one alternative embodiment of the device according to the invention that is suitable for processing a carrier-wafer combination 21 that has been applied to a foil 38 as described in principle above.

This is because the foil 38 is held by a film frame 39 that makes lateral access to the carrier-wafer combination 21 in the above-described manner difficult.

Therefore, in the embodiment according to FIG. 6, the release device 16 consists of an especially unsupported solvent line 40 with one output 41 that is located in the region of the side edge 23 of the carrier-wafer combination 21. In the process step of stripping, the interconnect layer 3 on the side edge 23 can be exposed to the solvent.

To detach the wafer 4 that has been fixed on the foil 38 and the film frame 39, the stripping means for stripping the wafer from the carrier in addition to the wafer receiver 9 have a film frame receiver 42.

The film frame receiver 42 is located between the wafer receiver 9 and the wafer receiver actuator arm 30 and is connected to the vacuum that prevails on the pressure line 10. The film frame receiver 42 has suction cups 43 that can suction the film frame 39 and that are located on the periphery of the film frame receiver 42.

The function of the suction cups 43 corresponds essentially to the function of the suction cups 14.

In another embodiment according to the invention, the carrier-wafer combination 21 consists of a second carrier that is analogously connected to the wafer 4 on the side opposite the carrier 1 via a second interconnect layer. In this way, the wafer 4, for example by providing different connecting means in the two interconnect layers and correspondingly different solvents, can be placed on another carrier or turned without having to handle the wafer 4 in isolation. The wafer 4 is always supported by a carrier, either by the carrier 1 or by the second carrier.

DESCRIPTION OF THE REFERENCE NUMERALS

A Receiving plane
1 Carrier
2 Adhesion-reducing layer
3 Interconnect layer
4 Wafer
5 Drive motor
5w Drive shaft
6 Receiving means
7 Process chamber
8 Drain
9 Wafer receiver
10 Pressure line
11 Wafer holder receiver
12 Sensor line
13 Sensor
14 Suction cups
15 Wafer receiver support
16 Release device
17 Fluid line
18 Actuator
19 Solvent line
20 Solvent actuator
21 Carrier-wafer combination
22 Inner region
23 Side edge
24 Bottom
25 Leg
26 Leg
27 Side wall
28 Working chamber
29 Actuator arm
30 Wafer receiver actuator arm
31 Solvent actuator arm
32 Arrow
33 Rotary arrows
34 Solvent
35 Face
36 Face
37 Solvent
38 Foil
39 Film frame
40 Solvent line
41 Output
42 Film frame receiver
43 Suction cups Having described the invention, the following is claimed:

1. Device for releasing an interconnect layer that provides a connection between a carrier and a wafer to form a carrier-wafer combination, wherein said interconnect layer provides the connection at a peripheral edge of the carrier-wafer combination said device comprising:
   a connection release means for providing an immersion bath that receives the carrier-wafer combination to unfix the connection, said connection release means including:
      a working chamber for surrounding only a section of the peripheral edge of the carrier-wafer combination, and
      means for delivering a solvent to the working chamber to fill at least a portion of the working chamber with the solvent, said solvent for dissolving the interconnect layer at the peripheral edge of the carrier-wafer combination; and
   a rotation means for rotating the carrier-wafer combination to move only the peripheral edge of the carrier-wafer combination through the working chamber of the connection release means to contact only the peripheral edge of the carrier-wafer combination with the solvent filling the working chamber, thereby releasing the interconnect layer from at least one of the carrier and the wafer and breaking the connection at the peripheral edge of the carrier-wafer combination.

2. Device according to claim 1, wherein the connection release means has a U-shaped cross section that defines said working chamber.

3. Device according to claim 1, wherein a side wall and a pair of legs extending from the side wall define said working chamber, said working chamber open towards the carrier-wafer combination.

4. Device according to claim 1, wherein said device further comprises:
   a receiving means for receiving the carrier-wafer combination on a receiving plane having a tilt angle to the horizontal that is between 5° and 90°.

5. Device according to claim 4, wherein said tilt angle of the receiving plane is between 25° and 90°.

6. Device according to claim 5, wherein said tilt angle of the receiving plane is between 45° and 90°.

7. Device according to claim 6, wherein said tilt angle of the receiving plane is 90°.

8. Device according to claim 1, wherein the connection release means operates in a temperature range from 0° C. to 350° C.

9. Device according to claim 1, wherein the connection release means operates essentially without heating.

10. Device according to claim 1, wherein the connection release means further comprises:
   mechanical separating means including a blade for cutting through the interconnect layer, and for detaching the interconnect layer from at least one of said wafer and said carrier.

11. Device according to claim 1, wherein the connection release means further comprises a UV light source for detaching the interconnect layer from at least one of said wafer and said carrier.

12. Device according to claim 1, wherein the peripheral edge of the carrier-wafer combination is sealed within the working chamber of the connection release means.

13. Device according to claim 12, wherein the working chamber has an open end for receiving a sector of the peripheral edge of the carrier-wafer combination.

14. Device according to claim 1, wherein said device further comprises:
   stripping means for stripping the wafer from the carrier, or for stripping the carrier from the wafer.

15. Device according to claim 14, wherein the stripping means is rotatable.

16. Device according to claim 1, wherein the interconnect layer is a thermoplastic adhesive.

17. Device according to claim 1, wherein the connection release means includes a solvent line for supplying detergents for cleaning the wafer.

18. Device according to claim 1, wherein said rotation means includes a rotating shaft.

* * * * *